(12) United States Patent
Jung et al.

(10) Patent No.: US 9,543,732 B2
(45) Date of Patent: Jan. 10, 2017

(54) LASER WAVELENGTH CONVERSION APPARATUS

(71) Applicant: GWANGJU INSTITUTE OF SCIENCE AND TECHNOLOGY, Gwangju (KR)

(72) Inventors: Changsoo Jung, Gwangju (KR); Young-Chul Noh, Gwangju (KR); Bong-Ahn Yu, Gwangju (KR); Woo Jin Shin, Gwangju (KR); Yeung Lak Lee, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 194 days.

(21) Appl. No.: 14/480,101

(22) Filed: Sep. 8, 2014

(65) Prior Publication Data
US 2015/0071313 A1 Mar. 12, 2015

(30) Foreign Application Priority Data
Sep. 9, 2013 (KR) .................. 10-2013-0107756

(51) Int. Cl.
*H01S 3/10* (2006.01)
*G02F 1/35* (2006.01)
(Continued)

(52) U.S. Cl.
CPC .............. *H01S 3/0092* (2013.01); *G02B 3/00* (2013.01); *G02F 1/3534* (2013.01); *H01S 3/005* (2013.01); *H01S 5/0092* (2013.01)

(58) Field of Classification Search
CPC ..... G02F 1/3534; H01S 3/0092; H01S 5/0092
See application file for complete search history.

(56) References Cited

U.S. PATENT DOCUMENTS

| | | | | |
|---|---|---|---|---|
| 5,748,664 A | * | 5/1998 | Dunn | H01S 3/042 372/10 |
| 6,347,102 B1 | * | 2/2002 | Konno | B23K 26/06 372/10 |

(Continued)

OTHER PUBLICATIONS

Bin Li et al., High Efficiency Generation of 355nm Radiation by Extra-Cavity Frequency Conversion, Article, Received Nov. 8, 2009, Accepted and published 2010, pp. 3497-3499, Optics Communications 283.

(Continued)

*Primary Examiner* — Daniel Petkovsek
(74) *Attorney, Agent, or Firm* — Hauptman Ham, LLP

(57) ABSTRACT

Disclosed is a laser wavelength conversion apparatus. The apparatus includes a focusing lens formed of a birefringent material and configured to have a same refractive index for an infrared laser beam and a green laser beam having different polarization directions and focus the infrared laser beam and the green laser beam without a chromatic aberration, and a sum frequency generator configured to combine the infrared laser beam and the green laser beam focused by the focusing lens to generate an ultraviolet laser beam. The apparatus of the present invention can solve a problem due to a chromatic aberration of the focusing lens, thereby improving a wavelength conversion efficiency and a beam quality.

6 Claims, 4 Drawing Sheets

(51) Int. Cl.
*H01S 3/00* (2006.01)
*G02B 3/00* (2006.01)
*H01S 5/00* (2006.01)

(56) References Cited

U.S. PATENT DOCUMENTS

| | | | | |
|---|---|---|---|---|
| 7,113,325 B1* | 9/2006 | Moulton | ............... | G02F 1/3544 |
| | | | | 359/326 |
| 8,422,119 B1* | 4/2013 | Keaton | ..................... | G02F 1/35 |
| | | | | 359/326 |
| 2003/0043452 A1 | 3/2003 | Heist | | |
| 2011/0243163 A1* | 10/2011 | Peng | ..................... | G02F 1/3534 |
| | | | | 372/22 |
| 2013/0188242 A1* | 7/2013 | Gapontsev | ............ | G02F 1/3534 |
| | | | | 359/329 |

OTHER PUBLICATIONS

C. Jung et al., Enhanced 355-nm Generation Using a Simple Method to Compensate for Walk-Off Loss, Article, Received Oct. 26, 2011, Accepted 2011 and published Jan. 4, 2012, pp. 941-948, vol. 20, No. 2, Optics Express.

* cited by examiner

LASER WAVELENGTH CONVERSION APPARATUS

CROSS REFERENCE TO RELATED APPLICATION

This application claims the benefit of Korean Patent Application No. 10-2013-0107756, filed on Sep. 9, 2013, entitled "LASER WAVELENGTH CONVERSION APPARATUS", which is hereby incorporated by reference in its entirety into this application.

BACKGROUND

1. Technical Field

The present invention relates to a laser wavelength conversion apparatus, and more particularly, to a laser wavelength conversion apparatus which converts a wavelength of a laser beam to be applicable to precise machining.

2. Description of the Related Art

As a method for high-speed precise machining, ultraviolet laser machining is known in the art. In order to obtain an ultraviolet laser beam, a method of converting an infrared laser beam may be used.

In the method of converting an infrared laser beam into an ultraviolet laser beam, first, an infrared laser beam is subjected to partial wavelength conversion into a green laser beam through a second harmonic generator (SHG). Then, the green laser beam and the infrared laser beam are focused and combined through a sum frequency generator (SFG), thereby generating an ultraviolet laser beam. As the sum frequency generator, a non-linear optical material may be used. For example, lithium triborate (LBO) may be used.

To perform high-speed precise machining, an ultraviolet laser beam is required to have high repetition rate, high power, and high beam quality. In the case where the ultraviolet laser beam is generated by converting the wavelength of the infrared laser beam, the high repetition rate of the infrared laser beam causes decrease in pulse energy and peak power, and thus the size of the laser beam must be reduced by focusing the laser beam appropriately in order to increase wavelength conversion efficiency.

However, as the laser beam becomes smaller, chromatic aberration of a focusing lens becomes serious. When an infrared laser beam and a green laser beam are focused by an ultraviolet generating material, the infrared laser beam and the green laser beam are generally focused at different positions due to chromatic aberration of the focusing lens. In this case, interaction between the beams becomes weaker and causes deterioration in conversion efficiency for an ultraviolet beam. This phenomenon becomes more serious as the size of the focused beam size is reduced.

In order to solve such a problem, a method of using a concave mirror instead of a lens (see High efficiency generation of 355 nm radiation by extra-cavity frequency conversion: Optics Communications 283 (2010) 3497-3499) has been proposed in the related art. However, this technique has problems in that beam alignment is complicated and astigmatism of a spherical mirror occurs.

BRIEF SUMMARY

The present invention has been conceived to solve the problems of the related art and it is one aspect of the present invention to provide a laser wavelength conversion apparatus which can improve conversion efficiency for an ultraviolet laser beam and beam quality without any chromatic aberration.

In accordance with one aspect of the present invention, a laser wavelength conversion apparatus includes: a focusing lens formed of birefringent material and configured to have same refractive index for an infrared laser beam and a green laser beam having different polarization direction and focus the infrared laser beam and the green laser beam without chromatic aberration; and a sum frequency generator configured to combine the infrared laser beam and the green laser beams focused by the focusing lens to generate an ultraviolet laser beam.

In accordance with another aspect of the present invention, a focusing lens formed of birefringent material and configured to have same refractive index for an infrared laser beam and a green laser beam having different polarization direction and focus the infrared laser beam and the green laser beam without chromatic aberration; a walk-off compensation element compensating for walk-off occurring in the focusing lens; and a sum frequency generator configured to combine the infrared laser beam and the green laser beams focused by the focusing lens to generate an ultraviolet laser beam.

In accordance with a further aspect of the present invention, a focusing lens formed of birefringent material and configured to have same refractive index for an infrared laser beam and a green laser beam having different polarization direction and focus the infrared laser beam and the green laser beam without chromatic aberration; a half-wave plate rotating polarization directions of both the infrared laser beam and the green laser beam by an angle of 90°; and a sum frequency generator configured to combine the infrared laser beam and the green laser beams focused by the focusing lens to generate an ultraviolet laser beam, wherein the focusing lens have a thickness to compensate for walk-off occurred in the sum frequency generator in advance.

According to embodiments of the invention, the laser wavelength conversion apparatus can improve conversion efficiency for an ultraviolet laser beam and beam quality without any chromatic aberration. Thus, it is possible to generate an ultraviolet laser beam with high repetition rate, high power, and high beam quality for high-speed precise laser machining.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Hereinafter, embodiments of the invention will be described in detail with reference to the accompanying drawings. It should be understood that the present invention is not limited to the following embodiments and can be easily embodied in different ways such as addition, modification, deletion or the like of elements by those skilled in the art without departing from the scope of the present invention. The drawings can be exaggerated and simplified, and elements irrelevant the description will be omitted.

Figure 1:
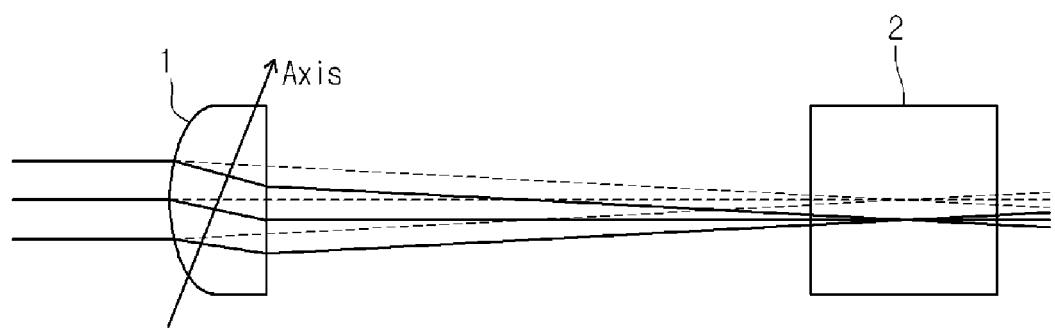
FIG. 1 is a view of a birefringence lens that focuses infrared and green laser beams.

FIG. 1 is a view of a birefringence lens that focuses infrared and green laser beams.

Referring to FIG. 1, a laser wavelength conversion apparatus includes a focusing lens 1 that focuses an infrared laser beam and a green laser beam, and a sum frequency generator (SFG) 2 that combines the infrared laser beam and the green laser beam to generate an ultraviolet laser beam. As the sum frequency generator 2, a nonlinear optical material may be used. For example, lithium triborate (LBO) may be used.

In one embodiment, the focusing lens 1 serves to focus an infrared laser beam and a green laser beam. Specifically, in order to maximize ultraviolet conversion efficiency of the sum frequency generator 2 using the infrared laser beam and the green laser beam focused to a small size, it is desirable that the infrared laser beam and the green laser beam be focused at one point inside the sum frequency generator 2 without chromatic aberration. To this end, the focusing lens according to this embodiment is configured as follows.

Configuration and operation of the focusing lens will now be described in more detail.

Chromatic aberration is caused since the focusing lens shows different refractive indices with regard to an infrared laser beam and a green laser beam, which have different wavelengths. However, when polarization directions of two beams are perpendicular to each other, a lens having no chromatic aberration can be formed of a suitable birefringent material and can be used to focus two beams at one point. To this end, the focusing lens 1 according to this embodiment may be formed of a birefringent material. When the focusing lens is formed of a positive birefringent material, an extraordinary refractive index ($n_e$) of which is greater than an ordinary refractive index ($n_o$) thereof, the two beams have the same index of refraction when the green laser beam having a short wavelength is an ordinary wave and the infrared laser beam having a long wavelength is an extraordinary wave. On the other hand, when the focusing lens is formed of a negative birefringent material, the extraordinary refractive index ($n_e$) of which is smaller than the ordinary refractive index ($n_o$) thereof, the two beams have the same index of refraction when the green laser beam having a short wavelength is an extraordinary wave and the infrared laser beam having a long wavelength is an ordinary wave. As the birefringent material for the focusing lens 1, magnesium fluoride ($MgF_2$) may be used. In this embodiment, a magnesium fluoride ($MgF_2$) crystal is a positive birefringent material and has refractive indexes with regard to two wavelengths of 1064 nm and 532 nm, as shown in Table 1.

TABLE 1

| Wavelength | $n_o$ | $n_e$ |
|---|---|---|
| 1064 nm | 1.373193 | 1.384779 |
| 532 nm | 1.378925 | 1.390790 |

First, since magnesium fluoride is the positive birefringent material, a green laser beam of an ordinary wave has an ordinary refractive index of 1.378925. On the other hand, an infrared laser beam of an extraordinary wave has a refractive index varied depending upon a direction of a wave vector of the infrared laser beam within the material. To have the same refractive index as the green laser beam, the direction of the wave vector of the infrared laser beam may be obtained by Expression 1:

$$\frac{1}{n_e^2(\theta)} = \frac{\cos^2\theta}{n_o^2} + \frac{\sin^2\theta}{n_e^2},$$

wherein $\theta$ is an angle of the infrared laser beam wave vector with respect to a crystalline optic axis, $n_o$ and $n_e$ are respectively the ordinary refractive index and the extraordinary refractive index, and $n_e(\theta)$ is an actual refractive index experienced by the infrared laser beam.

Since the ordinary and extraordinary refractive indexes of the infrared laser beam are as shown in Table 1, the direction of the infrared laser beam wave vector, i.e. $\theta$, is 44.9° in order to have the same actual refractive index of the infrared laser beam as the refractive index of the green laser beam. Therefore, it can be seen that the magnesium fluoride ($MgF_2$) crystal should be cut to have a thickness direction at an angle of 44.9° with respect to the crystalline optic axis when forming the focusing lens 1.

Unlike the ordinary wave, since the extraordinary wave undergoes walk-off phenomenon within the birefringent material, two beams are split in a direction perpendicular to a traveling direction thereof after passing through the focusing lens 1, as shown in FIG. 1, and are finally focused at different points. To solve this problem, it can be suggested to decrease the thickness of the focusing lens 1 such that a split distance between the two beams can be sufficiently smaller than the diameter of the beams.

Figure 2:
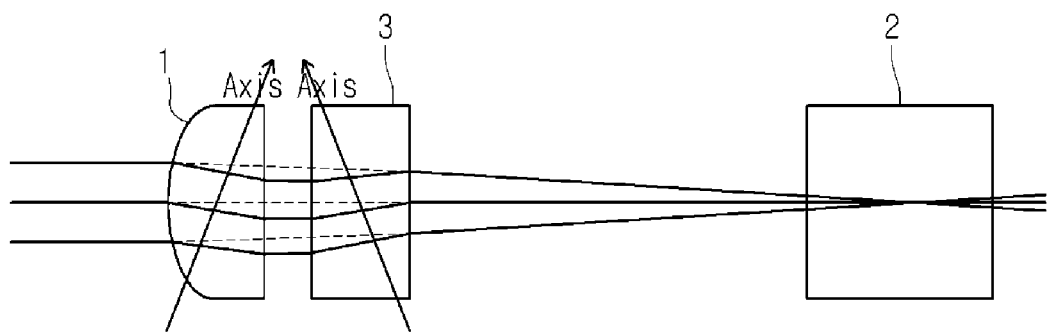
FIG. 2 is a view showing a birefringence lens and a walk-off compensation element when focusing infrared and green laser beams.

Alternatively, an element 3 for compensating for walk-off that occurs in the focusing lens 1 may be placed behind the focusing lens 1, as shown in FIG. 2. To compensate for walk-off occurring in the focusing lens 1, the walk-off compensation element 3 has a crystal axis facing the crystal axis of the focusing lens such that walk-off in the walk-off compensation element 3 can occur in an opposite direction to walk-off of the focusing lens 1. The walk-off compensation element 3 may be formed of the same material as or a different material from that of the focusing lens 1.

In the structure of the focusing lens 1, an output surface of the focusing lens 1 must be plane. While the extraordinary wave passes through the focusing lens 1 and undergoes walk-off, the center of the beam deviates from a center line of the focusing lens 1. Therefore, if the output surface of the focusing lens 1 is curved, the center of the beam is refracted and the traveling direction of the extraordinary wave is changed after the extraordinary wave passes through the focusing lens 1.

In the structure of the walk-off compensation element 3, an input surface of the walk-off compensation element 3 must be flat. However, the walk-off compensation element 3 may have a curved output surface. On the output surface of the walk-off compensation element 3, walk-off of the focusing lens 1 is thoroughly compensated for and thus the center of the extraordinary beam is aligned with the center line of the walk-off compensation element 3. Therefore, even though the exit surface of the walk-off compensation element 3 is curved, the center of the beam is not refracted and the traveling direction of the extraordinary wave is maintained after the extraordinary wave passes through the lens. For stability and convenience, the focusing lens 1 and the walk-off compensation element 3 may be coupled to each other to form an integrated body. If the two elements are formed of the same material, they may be coupled to each other by diffusion bonding or the like.

In the foregoing description, the compensation element 3 is separately provided to compensate for walk-off of the focusing lens 1. However, as necessary, walk-off occurring in the focusing lens 1 may be used, as disclosed in P. Heist, "Device for the frequency conversion of a fundamental laser frequency to other frequencies" (U.S. Patent Application Publication No. 2003/0043452 A1), and C. Jung, W. Shin, B.-A. Yu, Y. L. Lee, and Y.-C. Noh, "Enhanced 355-nm generation using a simple method to compensate for walk-off loss," Opt. Express 20, 941 (2012). That is, when one of infrared and green laser beams undergoes walk-off inside an sum frequency generator 2 to be largely split, the compensation element may be placed in front of the sum frequency generator 2 to compensate for walk-off. It should be understood that the disclosure of the foregoing references is incorporated herein without departing from the scope of the present invention.

Figure 3:
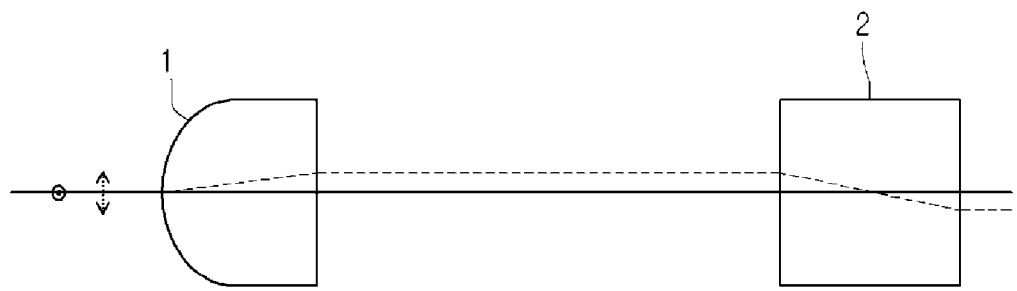
FIG. 3 is a view showing a case that the birefringence lens and an sum frequency generator have the same extraordinary wave beam while compensating for walk-off occurring in the sum frequency generator with the birefringence lens.

In this case, three elements, i.e. the focusing lens 1, the element for compensating walk-off of the sum frequency generator, and the sum frequency generator 2 are used. However, since not only does a birefringence lens serve to focus light, but also causes walk-off, it is possible to compensate for walk-off of the sum frequency generator 2, if walk-off inside the focusing lens 1 can be properly adjusted. When the birefringence lens is used as the focusing lens 1, two elements, i.e. the focusing lens 1 and the sum frequency generator 2, are sufficient. As shown in FIG. 3, if the focusing lens 1 and the sum frequency generator 2 have the same extraordinary wave beam, only the two elements are required, i.e. the focusing lens 1 and the sum frequency generator 2.

Figure 4:
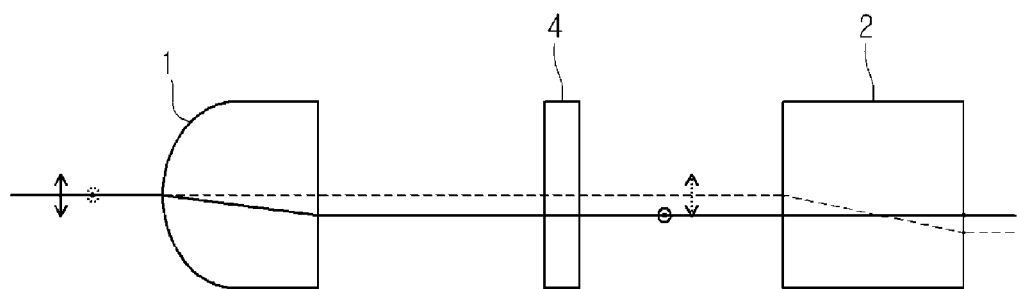
FIG. 4 is a view showing another case that the birefringence lens and the sum frequency generator have different extraordinary wave beams while compensating for walk-off occurring in the sum frequency generator with the birefringence lens.

However, as shown in FIG. 4, if two materials have different extraordinary wave beams, a half-wave plate 4 is additionally used to change polarization directions of both beams. Further, to maximize walk-off compensation, two materials must satisfy Expression: $\gamma_{lens} l_{lens} = \gamma_{SFG}(l_{SFG}/2)$. Here, $\gamma_{lens}$ and $l_{lens}$ are walk-off angle and a lens length of the focusing lens 1, respectively, and $\gamma_{SFG}$, and $l_{SFG}$ are walk-off angle and a lens length of the sum frequency generator 2, respectively. If a $MgF_2$ lens is used as the focusing lens 1 and a type-II LBO crystal is used as the sum frequency generator 2, the infrared laser beam must be the extraordinary wave undergoing walk-off in the focusing lens 1 and the green laser beam must be the extraordinary wave undergoing walk-off in the sum frequency generator 2. Thus, dual-wavelength half-wave plates are used to rotate polarization directions of the infrared and green laser beams by 90°. Since the $MgF_2$ crystal cut at an angle of 44.9° has walk-off angle of 8.4 mrad with regard to a wavelength of 1064 nm and the type-II LBO crystal for generating 355 nm has walk-off angle of 9.3 mrad with regard to a wavelength of 532 nm, the focusing lens 1 based upon MgF2 required to maximize walk-off compensation is 11 mm if the LBO crystal having a length of 20 mm is used as the sum frequency generator 2.

The laser wavelength conversion apparatus according to the embodiment can solve a problem of different focal points due to chromatic aberration or does not require a separate compensation element for compensating for walk-off in the sum frequency generator. As a result, it is possible to improve wavelength conversion efficiency for an ultraviolet beam and beam quality.

According to the present invention, the laser wavelength conversion apparatus secures high wavelength conversion efficiency and excellent beam quality without chromatic aberration even in the case where beams have a small diameter, thereby generating an ultraviolet laser beam with high repetition rate, high output and high quality applicable to high-speed precise laser machining.

Although some exemplary embodiments have been described herein, it should be understood by those skilled in the art that these embodiments are given by way of illustration only, and that various modifications, variations and alterations can be made without departing from the spirit and scope of the invention. The scope of the present invention should be defined by the appended claims and equivalents thereof.

What is claimed is:

1. A laser wavelength conversion apparatus comprising:
   a focusing lens formed of a birefringent material and configured to have a same refractive index for an infrared laser beam and a green laser beam having different polarization directions and focus the infrared laser beam and the green laser beam without chromatic a chromatic aberration; and
   a sum frequency generator configured to combine the infrared laser beam and the green laser beam focused by the focusing lens to generate an ultraviolet laser beam.

2. The laser wavelength conversion apparatus according to claim 1, wherein the focusing lens has a convex input surface and a plane output surface.

3. The laser wavelength conversion apparatus according to claim 1, wherein the focusing lens has a thickness such that a split distance between the infrared laser beam and the green laser beam after passing through the focusing lens are smaller than a beam diameter.

4. The laser wavelength conversion apparatus according to claim 1, wherein a walk-off occurring in the focusing lens compensates for a walk-off occurring in the sum frequency generator.

5. The laser wavelength conversion apparatus according to claim 1, wherein the birefringent material is magnesium fluoride.

6. The laser wavelength conversion apparatus according to claim 1, wherein the focusing lens has a thickness direction at an angle of 44.9° with respect to a crystalline optic axis such that the infrared laser beam having a wavelength of 1064 nm and the green laser beam having a wavelength of 532 nm have the same refractive index.

* * * * *